United States Patent
Raisanen et al.

(10) Patent No.: US 6,927,153 B2
(45) Date of Patent: Aug. 9, 2005

(54) ION IMPLANTATION WITH MULTIPLE CONCENTRATION LEVELS

(75) Inventors: Alan D. Raisanen, Sodus, NY (US); Shelby F. Nelson, Pittsford, NY (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 10/374,305

(22) Filed: Feb. 25, 2003

(65) Prior Publication Data

US 2004/0164379 A1 Aug. 26, 2004

(Under 37 CFR 1.47)

(51) Int. Cl.$^7$ ............................................... H01L 21/22
(52) U.S. Cl. .................................... 438/549; 438/918
(58) Field of Search .............................. 257/607, 341, 257/342; 438/407, 520, 528, 548, 918, 549

(56) References Cited

U.S. PATENT DOCUMENTS 5,973,361 A * 10/1999 Hshieh et al. .............. 257/341

* cited by examiner

*Primary Examiner*—Steven Loke
(74) *Attorney, Agent, or Firm*—Maginot, Moore & Beck

(57) ABSTRACT

A method that includes providing a semiconductor substrate having a mask on a surface thereof. The mask includes a first region having no masking elements and a second region having a plurality of masking elements. Each of the plurality of masking elements has a dimension that is equal to a first length, the first length less than twice a diffusion length of a dopant. The method further includes bombarding the semiconductor substrate and masking element with ions of the dopant. The ions form a first impurity concentration in the first region and a second impurity concentration in the second region.

2 Claims, 4 Drawing Sheets

ION IMPLANTATION WITH MULTIPLE CONCENTRATION LEVELS

FIELD OF THE INVENTION

The present invention relates generally to semiconductor processes, and more particularly, to ion implantation in semiconductor processes.

BACKGROUND OF THE INVENTION

The manufacture of integrated circuits on semiconductors involves several steps. Such steps include growing a semiconductor material, slicing the semiconductor material into planar structures, and polishing the surface of the semiconductor. Once the semiconductor is polished, circuit elements may be formed by selectively introducing impurities, or dopant, into portions of the semiconductor. Impurities alter the electrical behavior of the semiconductor in predictable ways to create various circuit elements. One method of introducing impurities into the semiconductor is through ion implantation.

Ion implantation is a process in which impurities are implanted into the semiconductor substrate to form circuit elements within the semiconductor crystalline structure. In a typical ion implantation process, various parts of the substrate are masked with a pattern that is made of photoresist or another suitable material that substantially prevents the ions from penetrating. The portions of the silicon in which the mask is absent, i.e. where voids in the mask are present, absorb the ions during implantation. In this manner, impurities may be selective implanted within the substrate.

In general, the ion implantation process itself involves multiple steps. In particular, a mask must first be designed in accordance with the circuit layout. Thereafter, the silicon and mask are bombarded by ions. The mask is then removed in a suitable manner, many of which are known in the art.

Many integrated circuits employ different circuit components that require different concentrations of dopant. To form such different concentrations, the ion implantation step may be repeated for every different level of doping concentration required in the integrated circuit. For example, a first mask may mask all but the areas requiring a high level of doping concentration. Once the mask is applied to the surface, the ion implantation device then bombards the silicon and mask at the highest level. After implantation and removal of the first mask, a second mask is applied to the surface to mask all but the areas requiring a lower level of doping concentration. Ion implantation then takes place at the lower level.

While the above method can reliably implant dopant into a silicon substrate at multiple concentration levels, the manufacturing process is extended in substantial part by the repeated ion implantation operations. For example, if a particular integrated circuit requires four or five different dopant concentration levels, the repeated masking and implantation steps significantly lengthen the manufacturing process.

There is a need, therefore, with a method of implanting impurities into semiconductor substrates at multiple levels that has reduced processing time.

SUMMARY OF THE INVENTION

The present invention addresses the above needs, as well as others, by providing a method of implanting ions into a semiconductor substrate that allows multiple concentration levels to be implanted during a single ion bombardment operation. In particular, the method employs a mask that has features having a width that are less than twice the diffusion length of the impurity within the semiconductor substrate. Using such features, the volume of ions to particular portion of the substrate may be reduced, yet may be distributed throughout that portion by diffusion of the ions.

Embodiments of the subject invention include a method that includes providing a semiconductor substrate having a mask on a surface thereof. The mask includes a first region having no masking elements and a second region having a plurality of masking elements. Each of the plurality of masking elements has a dimension that is equal to a first length, the first length less than twice a diffusion length of a dopant. The method further includes bombarding the semiconductor substrate and masking element with ions of the dopant. The ions form a first impurity concentration in the first region and a second impurity concentration in the second region.

Other embodiments include a semiconductor product that is produced using the above-described method.

Still other embodiments of the subject invention include a semiconductor substrate having a mask on a surface thereof. The mask includes a first region having no masking elements and a second region having a plurality of masking elements. Each of the plurality of masking elements has a dimension that is equal to a first length, the first length less than twice a diffusion length of a dopant. The diffusion length of the dopant is defined as a length of diffusion under heating of the semiconductor substrate to a temperature exceeding that of an ion bombardment step.

The above described features and advantages, as well as others, will become more readily apparent to those of ordinary skill in the art by reference to the following detailed description and accompanying drawings.

DETAILED DESCRIPTION

Figure 1:
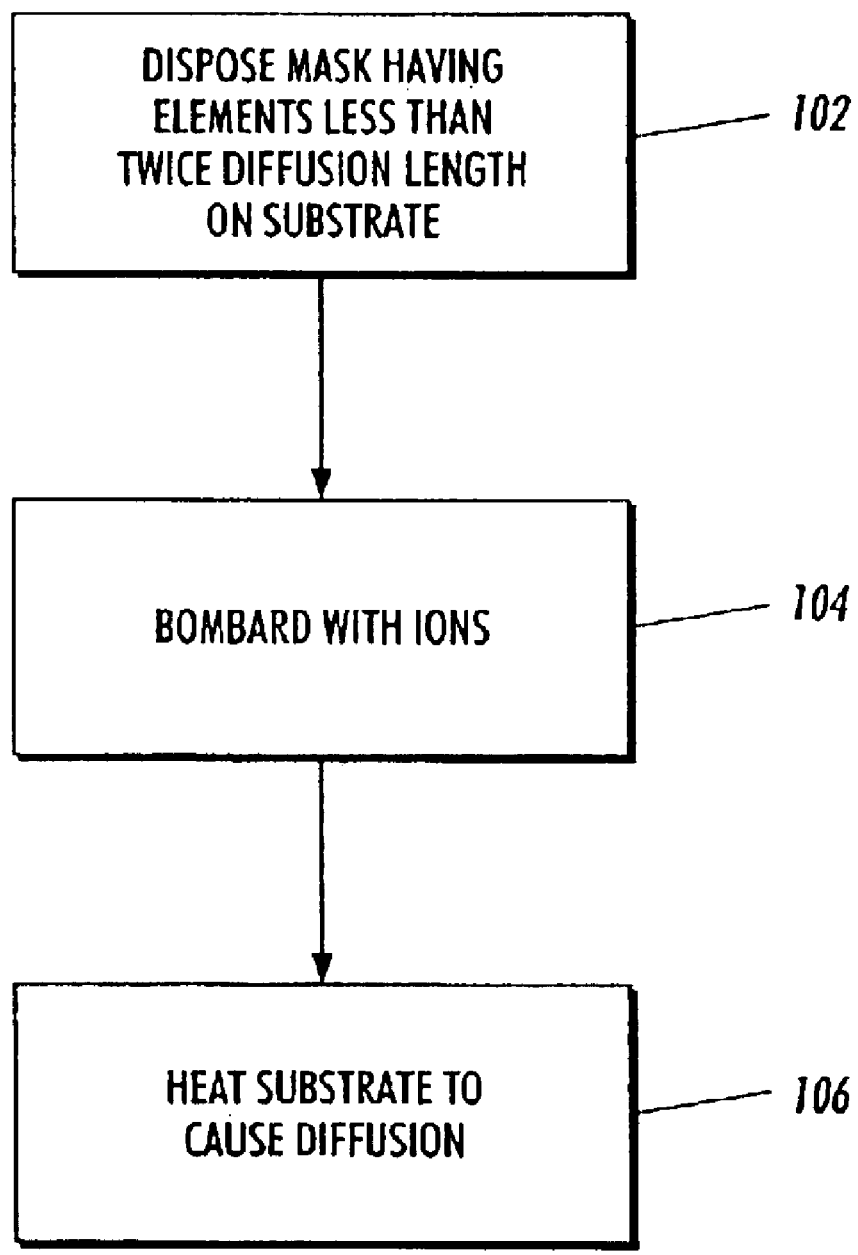
FIG. 1 shows a flow diagram of an exemplary set of ion implantation operations in accordance with embodiments of the subject invention.
Figure 2A:
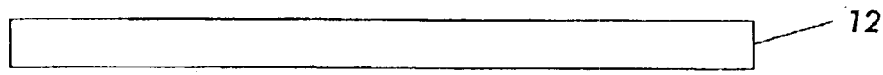
FIGS. 2a–2e show enlarged, diagrammatic cross sectional views of an exemplary substrate in various stages of the ion implantation process illustrated in FIG. 1.

FIG. 1 shows a flow diagram of an exemplary set of ion implantation operations in accordance with embodiments of the subject invention. FIGS. 2a through 2d show a diagrammatic cross sectional view of a substrate undergoing the operations of FIG. 1. Referring to FIG. 2a, the substrate 12 is a semiconductor substrate. In the exemplary embodiment described herein, the semiconductor substrate 12 is single crystal silicon. However, in alternative embodiments, the semiconductor substrate 12 may suitably be polysilicon, gallium arsenide, or other known semiconductor substrate.

The preparation of a semiconductor substrate is well known in the art. Typically, a semiconductor crystal is grown, sliced into wafers, and then polished. Ion implantation typically occurs on the polished wafer. FIG. 2a shows a diagrammatic cross section of the substrate 12 provided for ion implantation.

Referring now to FIG. 1, in step 102, a mask is disposed on the surface of the semiconductor substrate. The mask is a layer of aluminum or silicon dioxide material that has a geometry that corresponds to the layout of the circuit or circuits that are to be integrated into the semiconductor substrate. The mask geometry operates to selectively allow ions to be implanted into the semiconductor substrate. A silicon dioxide mask is disposed on the substrate by treating the top layers of the initial silicon substrate. In the alternative, other types of masks may be separately formed on the substrate.

To this end, the mask includes both masking elements and voids that located between masking elements. As is known in the art, the mask operates to block ions from entering the portions of the surface of the substrate that are located immediately below the masking element, and to allow ions to enter portions of the substrate surface located within the voids. The selective ion implantation alters the electrophysical behavior of the semiconductor substrate in local areas so as to form various circuit elements.

Figure 2B:
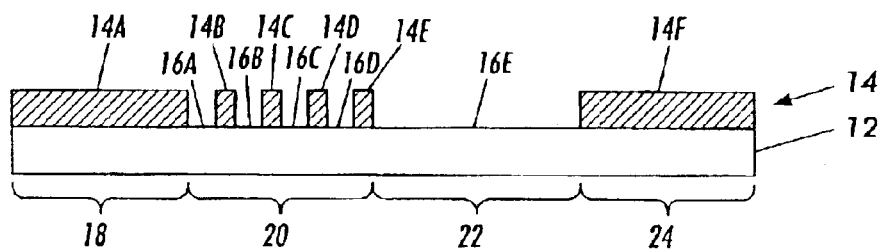
Figure 4:
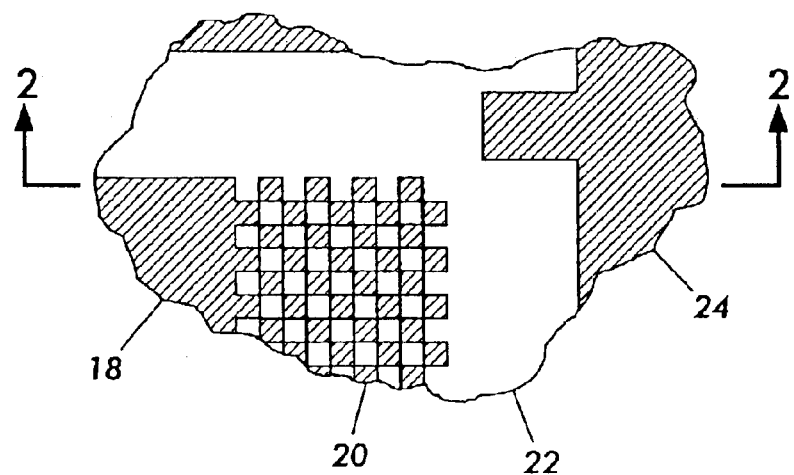
FIG. 4 shows a top diagrammatic view of a portion of the substrate of FIG. 2b having an exemplary mask that incorporates aspects of the invention.

FIG. 2b shows a diagrammatic cross section of the substrate 12 with portions of an exemplary mask 14 disposed thereon. FIG. 4 shows an exemplary top plan diagrammatic view of the substrate 12 with the exemplary mask disposed thereon.

The mask 14 includes a plurality of elements 14a–14f and a plurality of voids 16a–16e. The mask 14 is further defined by continuous regions, each of which is intended to allow a select average dopant concentration on the substrate 12.

In particular, the mask 14 includes a first region 18 defined completely by the element 14a and therefore has no voids. Thus, the first region 18 is intended to receive substantially no impurities or dopant during the ensuing implantation process.

The mask 14 further includes a second region 20 having a plurality of masking elements 14b–14e. A first small void 16a separates the first masking element 14a of the first region 18 from the first element 14b of the second region. The voids 14b through 14e are separated by corresponding voids 16b–16d, respectively.

It is noted that the masking elements 14b–14e have a width d that is significantly smaller than the width d' of the masking element 14a of the first region 18. The width d is chosen such that it is less than twice a diffusion length l of the ions to be implanted within the substrate 12. As will be discussed below, the use of masking elements having a width that is less than twice the diffusion length of the ions within the substrate allows for the second region 20 to have a relatively continuous ion implantation of reduced density. As a consequence, a single ion implantation operation may provide differing densities of impurities in the substrate 12.

The mask 14 further includes a third region 22 defined completely by single void 16e. The third region 22 defines an area in which a relatively high concentration of impurities or dopant is intended. Finally, the mask 14 includes a fourth region 24 defined completely by an element 14f. The element 14f has a width d'' that is several times d. The fourth region 24, like the first region 18, is intended to be substantially free of impurities after implantation.

Thus, the mask 14 shown in FIG. 2b includes a region 22 intended for a first level of implantation, a region 20 intended for a second level of implantation, and regions 18 and 24 intended for a third level of implantation (i.e. substantially none). It will be appreciated that the mask 14 is given by way of example only. The mask 14 may be readily adapted to accommodate any circuit geometry in which at least two levels of non-zero implantation are desired.

It will be appreciated that the mask 14 may be physically disposed on the substrate by any suitable masking method known in the art. Once the mask 14 is disposed on the substrate 12, step 102 is complete and step 104 may be executed.

Figure 2C:
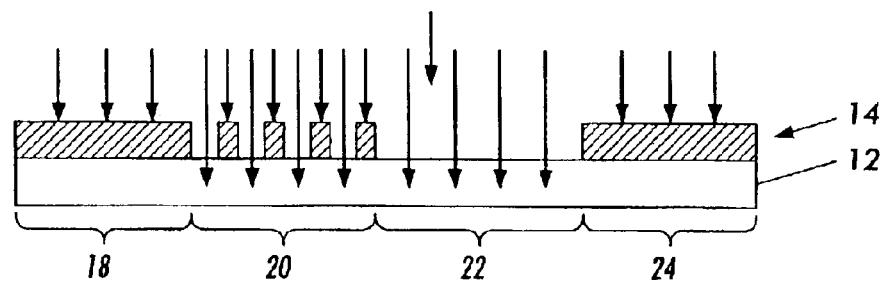

In step 104, the substrate 12 and the masking element 14 is bombarded with ions of a select dopant. The masking elements 14a–14f substantially block the ions from penetrating into the substrate, while the voids allow the ions to enter the substrate, as illustrated by FIG. 2c.

Figure 2D:
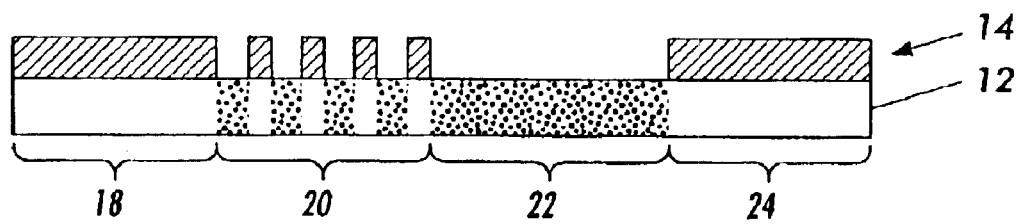

As is known in the art, the bombardment occurs such that the ion travel is substantially normal to the plane defined by the surface of the substrate 12. Accordingly, after bombardment in step 104, the impurities are concentrated in the areas of the substrate 12 that are located below the voids 16a–16e. FIG. 2d illustrates the substrate 12 and mask 14 after implantation, with the impurities located in the portions of the substrate 12 that correspond to the mask voids 16a–16e.

Figure 3:
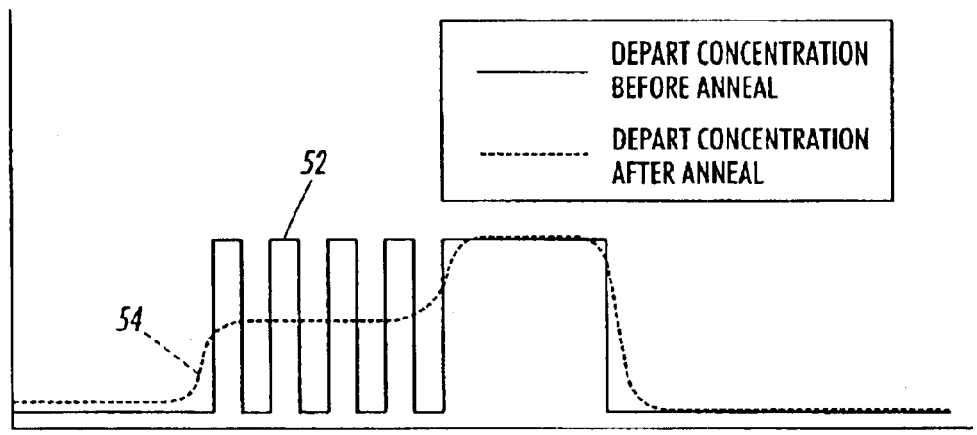
FIG. 3 shows a chart of dopant distribution throughout the substrate of FIGS. 2a–2e before and after annealing.

Accordingly, as a result of step 104, the ions are disposed in a somewhat discontinuous manner in the second region 20, substantially directly below the voids 16a–16e. FIG. 3 shows a illustrative graph of the distribution of ions within the substrate 12. The solid curve 52 shows the ion distribution as a function of position across the surface of the substrate 12 after step 104. As can be seen, essentially two levels of concentration exist after step 104: full density ion concentration at locations corresponding to the voids 16a–16e and substantially null density ion concentration at locations corresponding to the masking elements 14a–14f.

After step 104, the implanted substrate 12 is heated in step 106. In particular, the implant substrate 12 is heated to a temperature higher than that achieved during step 104. The heating has the effect of diffusing the ions both laterally and vertically within the substrate 12. The heating step may suitably be an annealing step commonly used in semiconductor manufacturing. Annealing typically occurs at temperatures of between 500° C. and 1000° C., depending on the substrate. Annealing is employed to repair damage done to the crystal during ion implantation, as is known in the art.

Regardless of how or why the heating occurs, application of heating in about the 500° C.–1000° C. range causes diffusion of the ions to a substantially predictable diffusion length. Diffusion length depends in part on the type of substrate used. For example, in an ordinary annealing operation, the diffusion length is typically 1–2 microns in a single-crystal silicon substrate, and is 7–8 microns in a polysilicon substrate.

As discussed further above, the masking elements 14b–14e have at least one dimension that is less than twice of the diffusion length of the implanted ions that is achieved during the heating operation. As a consequence, the heating operation of step 106 redistributes the ion concentration with the second region 20 of the substrate 12 such that the impurities are distributed over the entire second region. To achieve more even distribution of the impurities over the entire second region 20, each of the masking elements 14b–14e be somewhat less than twice the diffusion length, as twice the diffusion length substantially represents the maximum size that any continuous distribution of dopant may be achieved.

Figure 2E:
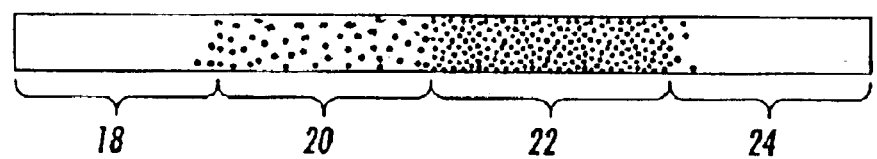

FIG. 2e illustrates the substrate 12 after the heating operation of step 106, and after removal of the mask 14. As shown in FIG. 2e, the impurities are distributed throughout the second region 20, as well as the third region 22. Because of the presence of the masking features 14b–14e in the second region 20, however, the overall or average concentration of the impurities in the second region 20 is less than that of the third region 22. Indeed, average concentration of the second region 20 may be estimated by calculating the ratio of the masking features 14b–14e to voids 16a–16d within the second region 20 and multiplying that ratio by the concentration of the unmasked regions, for example, the third region 22. With regard to the fully masked regions 18, 24, little or no impurities diffuse into the first region 18 and the fourth region 24 because the masking elements 14a and 14f are several times the diffusion length of the ions.

Referring again to FIG. 3, the broken line 54 shows the relationship of ion concentration as a function of position on the substrate after the heating operation. As illustrated in FIG. 3 the heating operation has the effect of averaging out the large swings in ion concentration with the second region 20 caused by the alternating small width voids and masking features within the second region 20.

As illustrated by the above example described in connection with FIGS. 1 and 2a–2e, by employing a mask having masking elements that have a dimension of less than twice the diffusion length of the ions, and following up with a heating step to effect the diffusion, multiple levels of impurities may be introduced into a semiconductor substrate with a single uniform ion bombardment operation.

It will be appreciated that by creating masks having regions with different proportions of voids to masking features, multiple different concentrations of impurities may be created. For example, three, four or more different concentrations of impurities may be achieved with a single ion bombardment step by varying the ratio of masking feature surface area to void surface area. Regardless of the ratio, however, at least one dimension of the masking feature should be less than twice the diffusion length (that is achievable in the heating operation), and preferably less than one diffusion length to improve the evenness of the distribution.

FIG. 4 shows an fragmentary top diagrammatic view of an exemplary layout of the substrate 12. As shown in FIG. 4, the regions 18, 20, 22 and 24 are just a few of several regions within the substrate, each of which has a two-dimensional shape. As also shown in FIG. 4, the masking features 14b–14e represent only one of multiple rows of masking features in the second region 20. As shown in FIG. 4, the masking features of the second region may form a checkerboard pattern in two dimensions in order to further aid in a relatively even distribution of the impurities after the heating operation. The masking features themselves may be of nearly any shape, including square, rectangular, triangular, rounded, circular or polygonal, so long as at least one dimension is less than twice the diffusion length of the impurities under the conditions of the heating operation.

It will be appreciated that the above described embodiments are merely exemplary, and that those of ordinary skill in the art may breadily devise their own implementations that incorporate the principles of the present invention and fall within the spirit and scope thereof.

We claim:

1. A method comprising:

providing a poly-silicon semiconductor substrate having a mask on a surface thereof, the mask including a first region having no masking elements and a second region having a plurality of masking elements, each of the masking elements has a dimension that is equal to a first length, the first length being less than twice a diffusion length of a dopant and the first length being less than fourteen microns; and bombarding the semiconductor substrate and the mask element with ions of the dopant to cause diffusion of the ions so that the ions form a first impurity concentration in the first region and a second impurity concentration in the second region so that the second impurity concentration is less than the first impurity concentration.

2. A method comprising:

providing a semiconductor substrate having a mask on a surface thereof, the mask including a first region having no masking elements and a second region having a plurality of masking elements, each of the masking elements has a dimension that is equal to a first length, that is less than a diffusion length of a dopant; and bombarding the semiconductor substrate and the mask with ions of the dopant to cause diffusion of the ions so that the ions form a first impurity concentration in the first region and a second impurity concentration in the second region, the second impurity concentration being less than the first impurity concentration.

* * * * *